United States Patent
Weizman et al.

(10) Patent No.: US 8,134,384 B2
(45) Date of Patent: Mar. 13, 2012

(54) METHOD FOR TESTING NOISE IMMUNITY OF AN INTEGRATED CIRCUIT AND A DEVICE HAVING NOISE IMMUNITY TESTING CAPABILITIES

(75) Inventors: Yoav Weizman, Kfar-Vitkin (IL);
Yehim-Haim Fefer, Petah Tikva (IL);
Sergey Sofer, Reshon Letzion (IL)

(73) Assignee: Freescale Semiconductor, Inc., Austin, TX (US)

( * ) Notice: Subject to any disclaimer, the term of this patent is extended or adjusted under 35 U.S.C. 154(b) by 406 days.

(21) Appl. No.: 12/514,005

(22) PCT Filed: Nov. 8, 2006

(86) PCT No.: PCT/IB2006/054168
§ 371 (c)(1),
(2), (4) Date: May 7, 2009

(87) PCT Pub. No.: WO2008/056206
PCT Pub. Date: May 15, 2008

(65) Prior Publication Data
US 2010/0001755 A1    Jan. 7, 2010

(51) Int. Cl.
*G01R 31/34* (2006.01)
(52) U.S. Cl. .................. 324/765.01; 324/613; 324/615; 324/76.53
(58) Field of Classification Search ............. 324/765
See application file for complete search history.

(56) References Cited

U.S. PATENT DOCUMENTS

| | | | |
|---|---|---|---|
| 7,023,195 B2 * | 4/2006 | Rosenbaum et al. | 324/76.53 |
| 7,233,889 B2 * | 6/2007 | Takahashi et al. | 703/14 |
| 2004/0223559 A1 | 11/2004 | Hill | |
| 2005/0044463 A1 | 2/2005 | Frisch | |
| 2006/0036980 A1 | 2/2006 | Kobayashi | |
| 2006/0209944 A1 | 9/2006 | Carballo et al. | |
| 2006/0220751 A1 | 10/2006 | Nakashiba et al. | |

FOREIGN PATENT DOCUMENTS

JP    11242063 A    9/1999

OTHER PUBLICATIONS

Goyal et al., "Reducing sampling clock jitter to improve SNR measurement of A/D converters in production test", May 2006, IEEE.*
Fefer et al; : Automatic System for VLSI on-chip clock synthesizer characterization 11th IEEE International Conference on Electronics, Circuits and Systems, Tel-Aviv, Israel, pp. 587-590, Dec. 2004.
Stark et al; "Analysis of timing jitter in inverters induced by power-supply noise"; Int'l Conference on Design and Test of Integrated Systems in Nanoscale Technology, 2006, USA, pp. 53-56.
Barton et al; "The effect of supply and substrate noise on jitter in ring oscillators"; IEEE 2002 Custom Integrated Circuits Conference, May 2002, Orlando, FL, USA.

* cited by examiner

*Primary Examiner* — Huy Q Phan
*Assistant Examiner* — Kathryn Chang

(57) ABSTRACT

A method for testing a noise immunity of an integrated circuit; the method includes: determining a value of a power supply noise regardless of a relationship between the power supply noise value and a phase sensitive signal edge position resulting from an introduction of the power supply noise; receiving, by the integrated circuit, a phase sensitive signal; introducing jitter to the phase sensitive signal by a circuit adapted to generate a substantially continuous range of power supply noise such as to alter edges position of the phase sensitive signal; providing the jittered phase sensitive signal to at least one tested component of the integrated circuit; and evaluating at least one output signal generated by the at least tested component to determine the noise immunity of the integrated circuit.

20 Claims, 4 Drawing Sheets

METHOD FOR TESTING NOISE IMMUNITY OF AN INTEGRATED CIRCUIT AND A DEVICE HAVING NOISE IMMUNITY TESTING CAPABILITIES

FIELD OF THE INVENTION

The present invention relates to methods for testing noise immunity of an integrated circuit and a device having noise immunity testing capabilities.

BACKGROUND OF THE INVENTION

Modern integrated circuits are required to operate at very high clock signal frequencies over a large range of environmental conditions.

Power supply noises can affect the performance of an integrated circuit. Power supply noises can affect the timing of periodic signals (such as but not limited to clock signals) generated by the integrated circuit or by a module (such as a phase locked loop (PLL) of the integrated circuit.

The relationship between power supply noises and the timing of clock signals of an integrated circuit is not known in advance and is also responsive to various processing parameters.

Noise immunity can be tested by controllable modulation (delay adjustment) of the position of the clock signal edges (the process is also referred to as clock jitter insertion). These tests require a tedious calibration sequence during which the relationship between the delay period and a power supply noise is calibrated.

There is a need to provide an efficient method and device for testing the noise immunity of an integrated circuit.

SUMMARY OF THE PRESENT INVENTION

A device and a method for testing one or more noise immunity characteristic of an analog circuit of an integrated circuit, as described in the accompanying claims.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The following figures illustrate exemplary embodiments of the invention. They are not intended to limit the scope of the invention but rather assist in understanding some of the embodiments of the invention. It is further noted that all the figures are out of scale.

The method and device use an analog circuit to introduce noises to input signals of a tested component of an integrated circuit. The input signal is a phase sensitive signal in the sense that its phase has an impact (conveniently a substantially impact) on the tested component of the integrated circuit. A phase sensitive signal can be a periodic signal such as but not limited to a clock signal. A phase sensitive signal can also be a non-periodic signal. The value of the power supply noise can be defined by the amplitude of the phase sensitive signal and there is no need to take into account the relationship between the value of the power supply noise and the delay (represented by the position of the edges of the phase sensitive signal). Thus, there is no need to undergo a tedious calibration sequence. Using an analog circuit enables to provide a substantially continuous range of power supply noise values.

For simplicity of explanation the following description relates to an analog supply voltage modulator circuit that is a current mirror. Those of skill in the art will appreciate that other analogues analog circuits can be used without departing from the spirit of the invention.

According to an embodiment of the invention the integrated circuit is expected to receive a phase sensitive signal that can be characterized by an allowable jitter level. Once such a phase sensitive signal is received the integrated circuit (or device that includes the integrated circuit) is expected to operate according to a predefined specification. If a jittered (also referred to as distorted) phase sensitive signal (having an allowable jitter level) causes the integrated circuit to deviate from the predefined specification then that integrated circuit can be declared as non-operational or not immune to noise. The integrated circuits or devices that include the integrated circuit are usually tested before being shipped to the customers.

Figure 1:
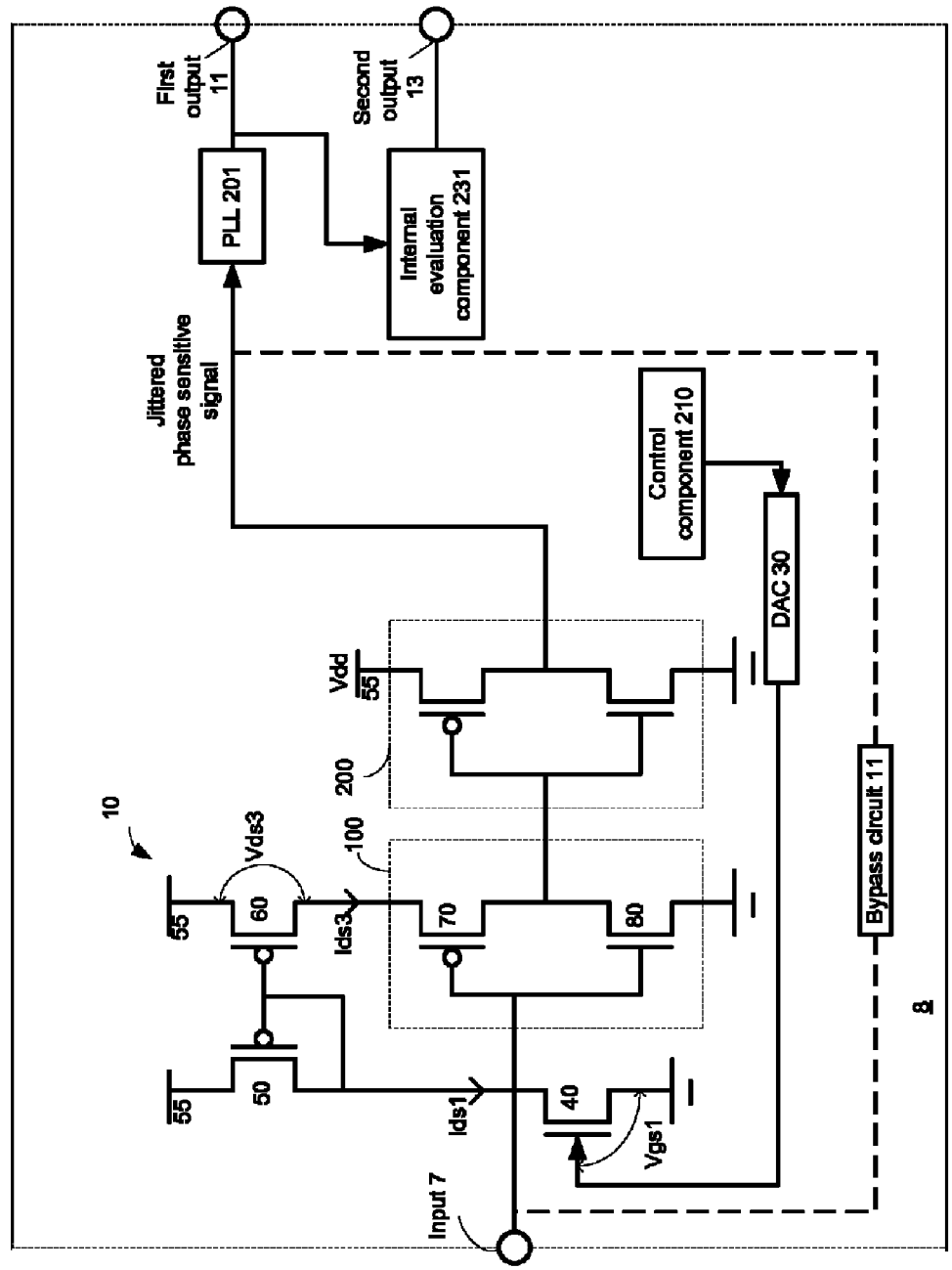
FIG. 1 illustrates a device, according to an embodiment of the invention.

FIG. 1 illustrates device 6 according to an embodiment of the invention.

Device 6 can include one or more integrated circuits, multiple integrated circuits. Device 6 can be a mobile phone, a personal data accessory, a media player, a computer, a controller and the like. Those of skill in the art will appreciate that device 6 can include many circuits that are not illustrated in FIG. 1. Alternatively, Device 6 can include fewer components than those that are illustrated in either one of the following drawings or include other components.

For simplicity of explanation it is assumed that device 6 includes a single integrated circuit 8.

Integrated circuit 8 has phase sensitive signal input 7, first output 11 and second output 13. It is noted that a typical integrated circuit includes multiple inputs and outputs but for simplicity of explanation they were omitted from FIG. 1. It is also noted that the amount of inputs that can be used during the evaluation of integrated circuit 8 sensitivity to clock jitter (i.e. jitter immunity) can differ from two inputs and two outputs. For example multiple output signals outputted via a plurality of outputs can be evaluated in order to evaluate the clock jitter immunity of integrated circuit 8.

Output 11 is used to provide output signals that can be processed to determine one or more clock jitter immunity characteristics of integrated circuit 8.

Output 13 is used to provide a test result. The test result can indicate if the integrated circuit 8 failed the test or passed the clock jitter immunity test. It can also provide more detailed information about one or more clock jitter immunity characteristics of integrated circuit 8.

It is noted that these output signals can be provided from a tested component of integrated circuit 8 or from another circuit that can be affected by one or more tested component of integrated circuit 8. For example, assuming that the tested component is a phase locked loop (PLL) such as PLL 201 of FIG. 1 then the output signal can be an output phase sensitive signal of PLL 201 (as illustrated by FIG. 1) or an output signal of another component of integrated circuit 8 that receives the output signal of PLL 201.

Integrated circuit 8 includes: (i) First inverter 100 that is adapted to receive a phase sensitive signal via input 7 of integrated circuit 8. (ii) An analog circuit such as current mirror 10 that is adapted to affect at least one transfer characteristic of first inverter 100 such that second inverter 200 outputs a jittered phase sensitive signal. (iii) One or more tested components such as PLL 201. (iv) Control component 210 that is adapted to provide, to current mirror 10, one or more digital control signals and may send to current mirror 10 a digital test pattern that alters a phase of the jittered phase sensitive signal over a testing range. (v) Internal evaluation component 231 adapted to at least partially evaluate the at least one output signal provided from a tested component or from another component that is affected by the tested component.

Analog circuit 10 can be bypassed, by bypass circuit 11, during non-test mode.

Figure 2:
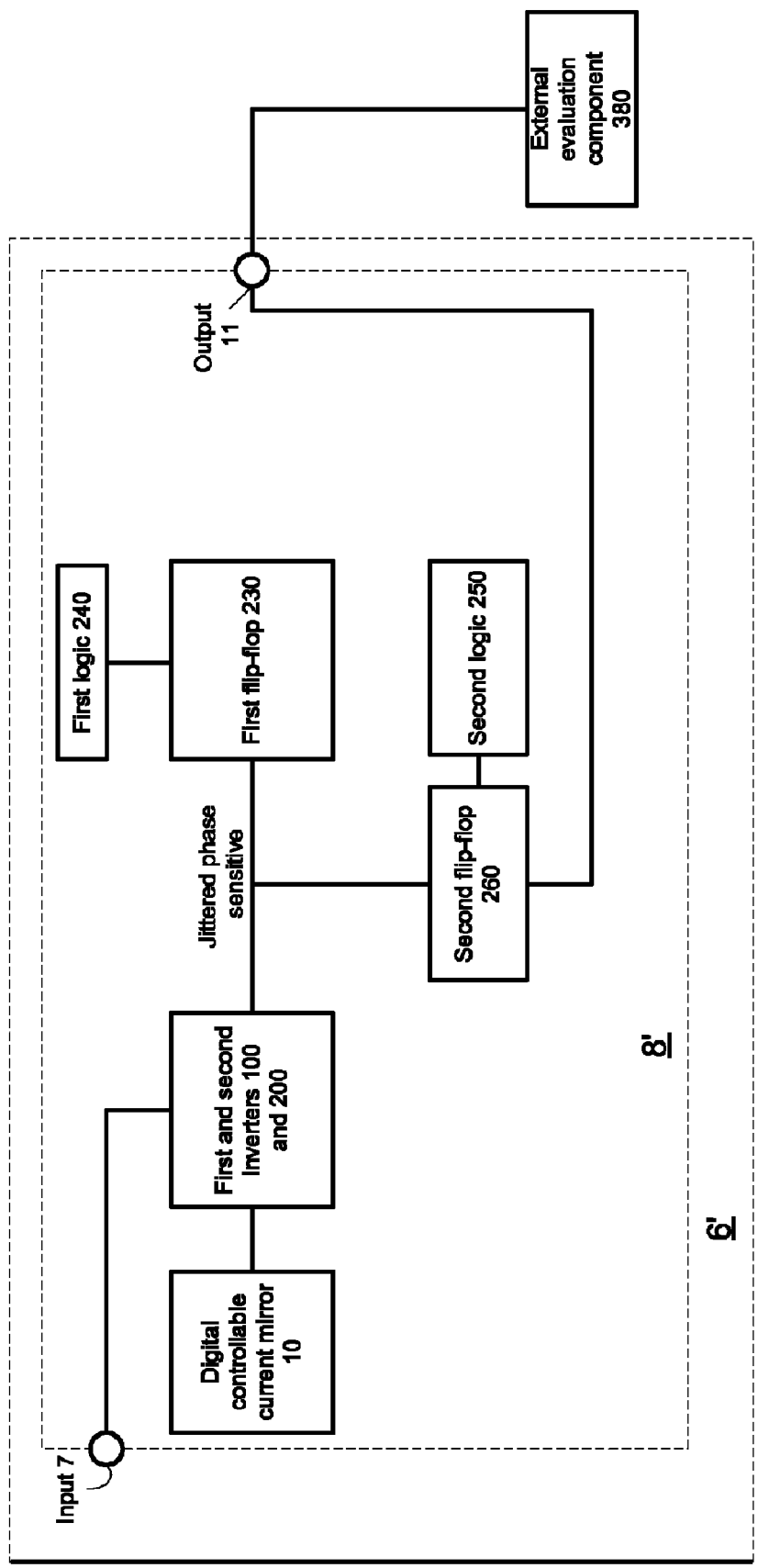
FIG. 2 illustrates a device and a testing device, according to an embodiment of the invention.
Figure 3:
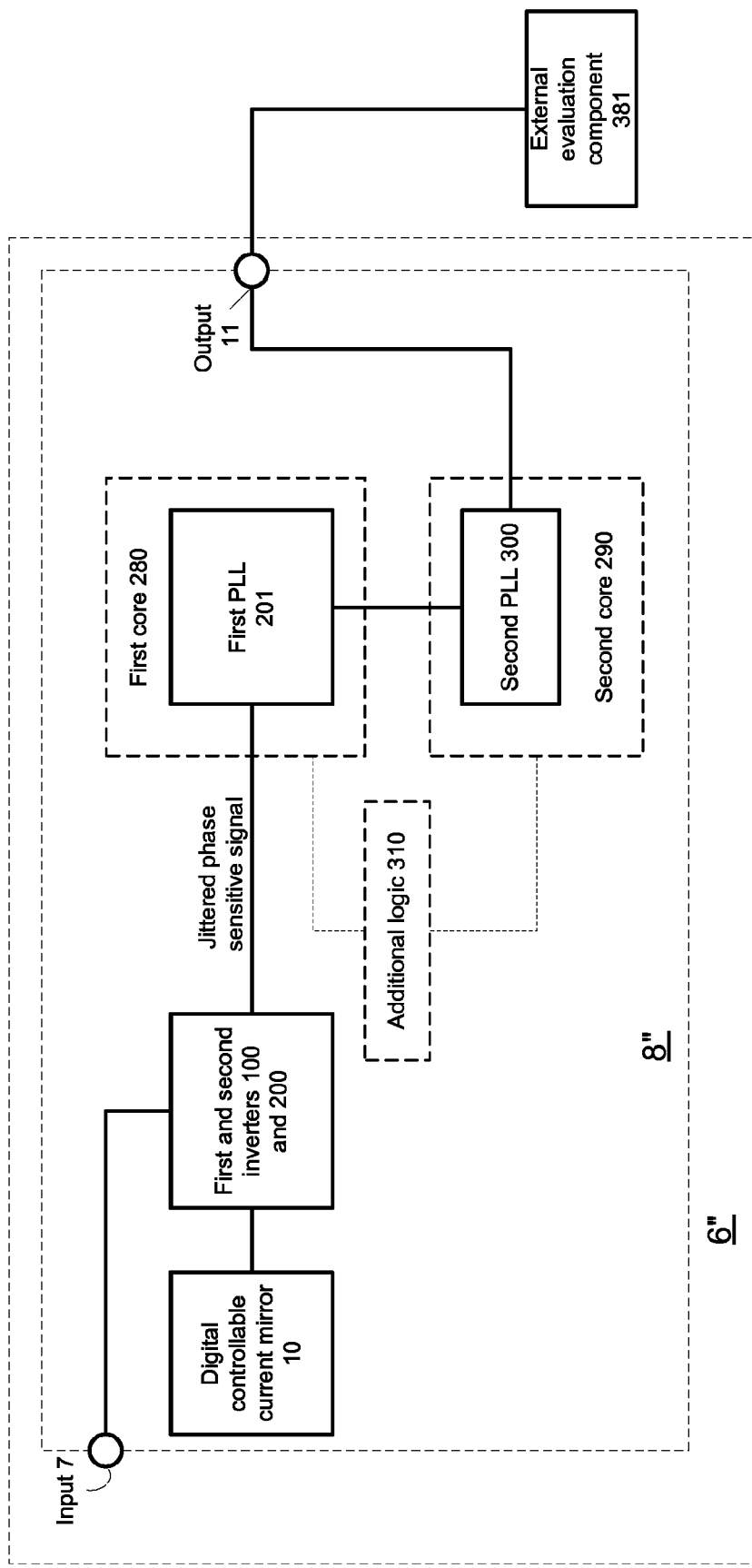
FIG. 3 illustrates a device and a testing device, according to an embodiment of the invention.

It is noted that although FIG. 1 illustrates internal evaluation component 231 that the evaluation can be done by an external evaluation component (such as external evaluation component 380 of FIG. 2 and FIG. 3). According to another embodiment of the invention the evaluation can be done in part by internal evaluation component 231 and in part by external evaluation component.

It is further noted that although FIG. 1 illustrated an internal control component 210 that the control component can be located outside integrated circuit 8. In such a case integrated circuit 8 should receive control signals that would control the operation of current mirror 10.

The relationship between the control signal provided to current mirror 10 and the affect on one or more transfer characteristics of first inverter 100 is usually measured, evaluated or calculated before the testing period. In response to this relationship one or more control signals are defined. For example, if the integrated circuit is expected to properly operate at a given clock jitter range then the control signals can be defined such as to scan this clock jitter range or to test the response of integrated circuit 8 to multiple clock jitter values within the clock jitter range.

Current mirror 10 is controlled by digital to analog converter (DAC) 30 and includes three transistors 40, 50 and 60.

DAC 30 receives a control signal and outputs an analog signal representative of the control word to the gate of first (n type) transistor 40. The source of first transistor 40 is grounded and its drain is connected to the gate and the drain of second (p type) transistor 50. The gates of second transistor 50 and the gate of third (p type) transistor 60 are connected to each other. The sources of second and third transistors 50 and 60 are connected to voltage supply 55.

The drain of third transistor 60 is connected to supply of first inverter 100 (to the source of first inverter (p type) transistor 70). The source of second inverter (n type) transistor 80 is connected to the drain of first inverter transistor 70 to provide an output node of first inverter 100. The gates of first and second inverter transistors are connected to each other to provide an input node of first inverter 100. The input node is connected to input 7 and it receives the phase sensitive signal. The output node of first inverter 100 can output a distorted phase sensitive signal. The analog signal outputted by DAC 30 determines the gate source voltage (Vgs1) of first transistor 40. The level of Vgs1 determines the source drain current (Ids1) that flows between the source and the drain of first transistor 40. Ids1 is mirrored by second and third transistors 50 60 to a source drain current Ids3 that flows through the source and drain of third transistor 30. Ids3 affects the source drain voltage (Vds3) of third transistor 60. The supply voltage of first inverter 100 equals to Vcc−Vds3.

Accordingly, the transition of the phase sensitive signal, outputted by first inverter 100, depends on Vcc−Vds3. It is noted that first inverter 100 is connected to second inverter 200. Second inverter 200 is connected to constant voltage supply 55, thus the phase of the jittered phase sensitive signal, outputted from second inverter 200 is dependent upon Vds3.

It is noted that a Built In Self Test component, available in many integrated circuits, can act as an internal evaluation circuit 231.

For example, of the tested component is PLL 201 that the evaluation can include checking phase, delay and/or frequency stability of a phase sensitive signal provided by the PLL in response to the jittered phase sensitive signal.

Yet for another example, both an internal and external evaluation circuits can participate in the evaluation of one or more jitter immunity characteristics of an integrated circuit.

FIG. 2 illustrates device 6' and external evaluation circuit 380, according to an embodiment of the invention.

Device 6' includes integrated circuit 8' in which the tested components are digital components and not an analog components or mixed signal components such as PLL.

Second inverter 200 provides a jittered phase sensitive signal to a clock input of first flip-flop 230 and to a clock input of second flip-flop 260. A data input of first flip-flop 230 is connected to first logic 240. A data input of second flip-flop 260 is connected to second logic 250. Second logic 250 is also connected to the output of first flip-flop 230. The output of second flip flop 260 is provided to external evaluation component 380. Output signals provided by second flip flop 260 are evaluated by external evaluation component 380, although according to other embodiments of the invention these output signals can be evaluated (at least partially) by an internal evaluation circuit.

FIG. 3 illustrates device 6" and external evaluation circuit 381, according to an embodiment of the invention.

Device 6" includes integrated circuit 8" in which the tested components are two serially connected PLLs 201 and 300 that belong to two different functional units (like first core 280 and second core 290) that form a sequence of PLLs.

Second inverter 200 provides a jittered phase sensitive signal to first PLL 201 of a first core 280 that belongs to integrated circuit 8". The output of first PLL is connected to an input of second PLL 300 of second core 290 that also belongs to integrated circuit 8". The first and second cores 280 and 290 are connected to additional logic 310.

The output phase sensitive signal provided by second PLL 300, whose jitter depends on the output of the Second inverter 200 and characteristics of the first PLL 201 and the second PLL 300, is sent to (and evaluated by) external evaluation component 381. According to other embodiments of the invention this output signal can be evaluated (at least partially) by an internal evaluation circuit.

It is noted that the external evaluation circuit 381 can be any conventional clock jitter measurement tool.

Those of skill in the art will appreciate that the evaluation of one or more clock jitter immunity characteristics of integrated circuit 8, 8' or 8" can be performed in an automatic manner (completely by a testing circuit), but this is not necessarily so. An operator can evaluate the one or more clock jitter immunity characteristic of integrated circuit 8, 8' or 8" based upon test results that are measured and/or displayed by the external evaluation circuit 381 or by device 6, 6' or 6".

Figure 4:
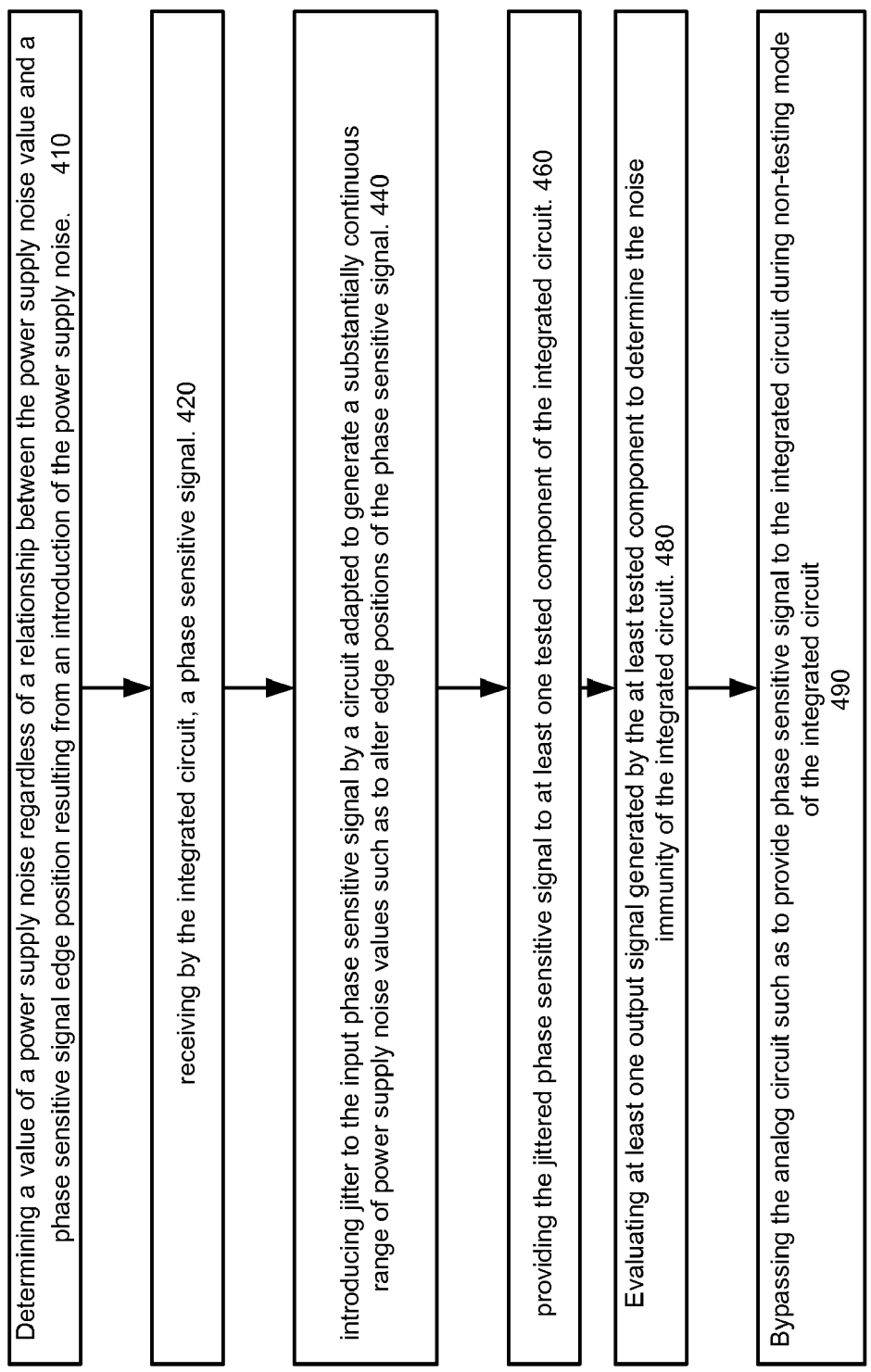
FIG. 4 is a flow chart of a method, according to an embodiment of the invention.

FIG. 4 is a flow chart of a method 400 for evaluating a noise immunity of an integrated circuit, according to an embodiment of the invention.

Method 100 starts by stage 410 of determining a value of a power supply noise regardless of a relationship between the power supply noise and a phase sensitive signal edge position resulting from an introduction of the power supply noise.

For example, assuming that the integrated circuit is supposed to operate properly at a given clock jitter range, then control signals to be provided during the test period can be defined such as to scan this clock jitter range. The determination is made in term of supply voltage, regardless of the relationship between the value of any inserted noise and a position of the phase sensitive signal edge, thus the calibration sequence is avoided. For example, if the power supply is expected to provide a supply voltage that can be accompanied by a certain noise level ($\Delta V$) then stage 410 can determine to provide a $\Delta V$ noise. There is no need to evaluate the delay ($\Delta T$) of the clock edge that can be caused by $\Delta V$, and then define a noise that will cause a delay of $\Delta T$.

The determination is responsive to a relationship between a value of a digital control signal provided to a noise generation circuit (such as a current mirror 10 of FIG. 1) and timing characteristics of a jittered phase sensitive signal provided to a tested component (such as a jittered phase sensitive signals provided from second inverter 200 of FIG. 1).

Stage 410 is followed by stage 420 of receiving, by the integrated circuit, a phase sensitive signal. Referring to the example set fourth in FIG. 1, a phase sensitive signal is provided to an input node of first inverter 100.

Stage 420 is followed by stage 440 of introducing jitter to the phase sensitive signal by a circuit adapted to generate a substantially continuous range of power supply noise such as to alter edges position of the phase sensitive signal. Stage 440 involves providing a jittered phase sensitive signal. Conveniently, stage 440 may include altering a current mirror's current that affects a transfer characteristics of a first inverter that receives the phase sensitive signal and belongs to the integrated circuit, such as to provide a distorted phase sensitive signal.

Referring to the example set fourth in FIG. 1, current mirror 10 can alter the transfer characteristic of the first inverter 100 that can output a distorted phase sensitive signal to the second inverter 200. The second inverter 200 provides a jittered phase sensitive signal to various tested components such as but not limited to first PLL 201.

Stage 440 is followed by stage 460 of providing the jittered phase sensitive signal to at least one tested component of the integrated circuit.

Conveniently, stage 460 can include providing the jittered phase sensitive signal to a phase locked loop, to a sequence of phase locked loops, to pure digital components, to a combination thereof and the like.

Stage 460 is followed by stage 480 of evaluating at least one output signal generated by the at least tested component to determine the noise immunity of the integrated circuit.

Referring to the example set fourth in FIG. 1, an output signal of first PLL 201 can be provided to internal evaluation component 230 that can determine if the integrated circuit 8 functions properly. Referring to the example set fourth in FIG. 3, an output signal of second PLL 300 can be provided to external evaluation component 381 that can determine if the integrated circuit 8'' functions properly.

It is noted that stage 480 can be followed by a query stage of determining whether another testing is required. If so, the control signal provided to the noise generation circuit can be changed (although this is not necessarily so) according to the test pattern defined during stage 410. The test pattern can alter the edge position of the jittered phase sensitive signal over a testing range.

Conveniently, stage 480 of evaluating includes evaluating the at least one output signal by an internal evaluation component that belongs to the integrated circuit.

Conveniently, stage 480 of evaluating includes evaluating the at least one output signal, at least partially by an external evaluation component that is coupled to the integrated circuit.

Conveniently, stage 480 is followed by stage 490 of bypassing the analog circuit such as to provide phase sensitive signal to the integrated circuit during non-testing mode of the integrated circuit. The bypassing can conveniently cancel any affect that the analog circuit may have on the phase sensitive signal during non-test modes.

Variations, modifications, and other implementations of what is described herein will occur to those of ordinary skill in the art without departing from the spirit and the scope of the invention as claimed. Accordingly, the invention is to be defined not by the preceding illustrative description but instead by the spirit and scope of the following claims.

We claim:

1. A method for testing a noise immunity of an integrated circuit, the method comprises:
   receiving, by the integrated circuit, a phase sensitive signal;
   determining a value of a power supply noise regardless of a relationship between the value of the power supply noise and a phase sensitive signal edge position resulting from an introduction of the power supply noise;
   introducing jitter to the phase sensitive signal by a circuit adapted to generate a substantially continuous range of power supply noise values such as to alter edge positions of the phase sensitive signal;
   providing the jittered phase sensitive signal to at least one tested component of the integrated circuit; and
   evaluating at least one output signal generated by the at least one tested component to determine the noise immunity of the integrated circuit.

2. The method according to claim 1 wherein the introducing comprises introducing the jitter by modulation of a power supply voltage of a phase sensitive signal path element that belongs to the integrated circuit.

3. The method according to claim 1 wherein the introducing the jitter comprises altering a shape of the phase sensitive signal.

4. The method according to claim 1 wherein the introducing the jitter comprises altering the edge positions of the jittered phase sensitive signal.

5. The method according to claim 1 wherein the introducing comprises providing a digital test pattern that alters an edge position of the jittered phase sensitive signal over a testing range.

6. The method according to claim 1 wherein the providing comprises providing the jittered phase sensitive signal to a phase locked loop.

7. The method according to claim 1 wherein the providing comprises providing the jittered phase sensitive signal to a sequence of phase locked loops.

8. The method according to claim 1 wherein the providing comprises providing the jittered phase sensitive signal to a digital component.

9. The method according to claim 1 wherein the evaluating comprises evaluating the at least one output signal by an internal evaluation component that belongs to the integrated circuit.

10. The method according to claim 1 wherein the evaluating comprises evaluating the at least one output signal, at least partially by an external evaluation component that is connected to the integrated circuit.

11. A device having a noise immunity testing capabilities, the device comprise:
   an integrated circuit that comprises:
      an input adapted to receive a phase sensitive signal wherein the integrated circuit comprising:
      an analog circuit adapted to generate a substantially continuous range of voltage supply noise values such as to alter an edge position of the phase sensitive signal;
      wherein a value of the power supply noise is determined regardless of a relationship between the power supply noise value and the edge position of the phase sensitive signal resulting from an introduction of the power supply noise;
      at least one tested component adapted to receive a jittered phase sensitive signal; and
      at least one output adapted to provide an output signal representative of a response of the at least one tested component to the jittered phase sensitive signal.

12. The device according to claim 11 wherein the analog circuit is a supply voltage modulator, adapted to affect a transfer characteristic of a phase sensitive signal path element.

13. The device according to claim 12, wherein the analog circuit is adapted to alter a shape of the phase sensitive signal.

14. The device according to claim 12, wherein the analog circuit is adapted to affect an edge position of the jittered phase sensitive signal, following an alteration of the shape of the phase sensitive signal.

15. The device according to any claim 12 wherein the integrated circuit further comprises a control component adapted to provide, to the analog circuit, a digital test pattern that alters a shape of the phase sensitive signal and an edge position of the jittered phase sensitive signal over a testing range.

16. The device according to claim 11 wherein a tested component is a phase locked loop.

17. The device according to claim 11 wherein a tested component is a sequence phase locked loops.

18. The device according to claim 11 wherein a tested component is a digital component.

19. The device according to claim 11 wherein the integrated circuit comprises an internal evaluation component adapted to at least partially evaluate the at least one output signal.

20. The device according to claim 11 wherein the device comprises a bypass circuit for bypassing the analog circuit during a non-testing mode of the integrated circuit.

* * * * *